(12) United States Patent
Carta et al.

(10) Patent No.: US 10,763,307 B1
(45) Date of Patent: Sep. 1, 2020

(54) STACKABLE CROSS-POINT PHASE-CHANGE MATERIAL MEMORY ARRAY WITH A RESISTIVE LINER

(71) Applicant: INTERNATIONAL BUSINESS MACHINES CORPORATION, Armonk, NY (US)

(72) Inventors: Fabio Carta, Pleasantville, NY (US); Chung Lam, Peekskill, NY (US); Matthew J. BrightSky, Pound Ridge, NY (US); Robert Bruce, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/380,618

(22) Filed: Apr. 10, 2019

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/14* (2013.01);
(Continued)

(58) Field of Classification Search
CPC ................... H01L 24/72; H01L 25/071; H01L 2924/10254; H01L 2924/10272;
(Continued)

(56) References Cited

U.S. PATENT DOCUMENTS

| 7,382,647 B1 | 6/2008 | Gopalakrishnan |
| 8,173,987 B2 | 5/2012 | Lung |

(Continued)

FOREIGN PATENT DOCUMENTS

WO   WO 2018/034699 A1   2/2018

OTHER PUBLICATIONS

Kim et al., "High-performance, cost-effective 2z nm two-deck cross-point memory integrated by self-align scheme for 128 Gb SCM", IEEE 2018, Sep. 2018, pp. 37.1.1-37.1.4.
(Continued)

*Primary Examiner* — Zandra V Smith
*Assistant Examiner* — Andre C Stevenson
(74) *Attorney, Agent, or Firm* — Tutunjian & Bitetto, P.C.; L. Jeffrey Kelly

(57) ABSTRACT

A method of forming a phase change material memory array is provided. The method includes forming a lower metallization layer on a substrate, and forming a plurality of upright slabs, where each of the slabs includes a lower buffer segment on the lower metallization layer, a phase change material segment on the lower buffer segment, an upper buffer segment on the phase change material segment, and an upper conductive segment on the upper buffer segment. The method further includes forming a resistive liner on the plurality of upright slabs, and forming a sidewall spacer layer on the resistive liner. The method further includes removing portions of the sidewall spacer layer and the resistive liner on the substrate and the upper conductive segment, wherein another portion of the resistive liner remains on the phase change material segment.

20 Claims, 10 Drawing Sheets

(52) U.S. Cl.
CPC ...... *H01L 45/1608* (2013.01); *H01L 45/1675* (2013.01); *H01L 45/1683* (2013.01); *H01L 45/1691* (2013.01)

(58) Field of Classification Search
CPC ..... H01L 2924/1033; H01L 2924/1203; H01L 2924/13055
See application file for complete search history.

(56) References Cited

U.S. PATENT DOCUMENTS

| | | |
|---|---|---|
| 9,716,226 B2 | 7/2017 | Gealy et al. |
| 9,806,129 B2 * | 10/2017 | Ravasio ............. H01L 27/2427 |
| 2013/0235655 A1 | 9/2013 | Tang |
| 2017/0133435 A1 | 5/2017 | Shepard |
| 2019/0386213 A1 * | 12/2019 | Lai ..................... H01L 45/1608 |

OTHER PUBLICATIONS

Kim, S., et al., "A Phase Change Memory Cell with Metallic Surfactant Layer as a Resistance Drift Stabilizer", IEEE 2013, Dec. 2013, pp. 30.7.1-30.7.4.

Niu et al., "Low Power Multi-Level-Cell Resistive Memory Design with Incomplete Data Mapping", IEEE 2013, Oct. 2013, pp. 131-137.

* cited by examiner

STACKABLE CROSS-POINT PHASE-CHANGE MATERIAL MEMORY ARRAY WITH A RESISTIVE LINER

BACKGROUND

The present invention generally relates to a phase-change material (PCM) memory array, and more particularly to a 3-D stackable cross-point PCM memory array.

Phase change material can be used as a type of non-volatile memory to store data. Each memory cell of a phase-change random access memory can include phase change material that can be addressed. The information can be stored in the phase change material by changing the electrical resistance of the phase change material.

SUMMARY

In accordance with an embodiment of the present invention, a method of forming a phase change material memory array is provided. The method includes forming a lower metallization layer on a substrate, and forming a plurality of upright slabs, where each of the slabs includes a lower buffer segment on the lower metallization layer, a phase change material segment on the lower buffer segment, an upper buffer segment on the phase change material segment, and an upper conductive segment on the upper buffer segment. The method further includes forming a resistive liner on the plurality of upright slabs, and forming a sidewall spacer layer on the resistive liner. The method further includes removing portions of the sidewall spacer layer and the resistive liner on the substrate and the upper conductive segment, wherein another portion of the resistive liner remains on the phase change material segment.

In accordance with another embodiment of the present invention, a method of forming a phase change material memory array is provided. The method includes forming a lower metallization layer on a substrate, and forming a lower buffer layer on the lower metallization layer. The method further includes forming a selector material layer on the lower buffer layer, and forming a plurality of upright slabs, where each of the slabs includes an intermediate buffer segment on the selector material layer, a phase change material segment on the intermediate buffer segment, an upper buffer segment on the phase change material segment, and an upper conductive segment on the upper buffer segment. The method further includes forming a resistive liner on the plurality of upright slabs, and forming a sidewall spacer layer on the resistive liner. The method further includes removing the portions of the sidewall spacer layer and the resistive liner on the upper conductive segment, wherein another portion of the resistive liner remains on the phase change material segment.

In accordance with yet another embodiment of the present invention, a phase change material memory array is provided. The phase change material memory array includes a lower metallization layer segment on a substrate, and a plurality of upright columns, where each of the upright columns includes a lower buffer plate on the lower metallization layer segment, a phase change material block on the lower buffer plate, an upper buffer plate on the phase change material block, and an upper conductive plate on the upper buffer plate. The phase change material memory array further includes an upper metallization layer segment on the upper buffer plate of a subset of the plurality of upright columns, and a first pair of resistive liner segments on opposite sidewalls of each of the plurality of upright columns. The phase change material memory array further includes a second pair of resistive liner segments on opposite sidewalls of each of the plurality of upright columns 90 degrees from the first pair of resistive liner segments, a pair of sidewall spacer layer segments on the first pair of resistive liner segments, and a fill layer with air gaps between the upright columns.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide cross-point integration that allows fabrication of a high density Phase Change Memory (PCM) array through a self-aligned fabrication process, where two perpendicular etches can define the memory cell (with or without an access device (e.g., a polysilicon diode, or ovonic threshold switch). Ovonic devices, threshold devices, polysilicon diodes, and in general non-linear I-V devices can be used. Ovonic devices are chalcogenide materials that can change from an electrically nonconducting state to a conducting state with the application of a certain minimum voltage.

Embodiments of the present invention provide a phase change material memory cell with a parallel current path through a resistive liner. Phase change materials can experience resistance drift, which can limit the number of level in which a single memory cell can be programmed, limiting the number of bits that can be represented per cell. Mitigating the resistance drift can provide a multi-level memory cell (MLC) that can be deployed in a cross-point array to boost the array density and effectively reducing the cost per bit.

Embodiments of the present invention provide a method of fabricating a phase change material memory cell with a parallel current path through a resistive liner to mitigate resistance drift of the phase change material. The phase change memory cell(s) can include a phase change material that can switch between a non-volatile amorphous state and a non-volatile crystalline state that provide different determinable resistance levels. The physical state of the phase change material can remain unchanged with the removal of electric power/voltage, which can be referred to as an ovonic threshold switch.

Embodiments of the present invention provide 3D stackable MLC cross-point arrays with and without a self-aligned selector.

Exemplary applications/uses to which the present invention can be applied include, but are not limited to: memory devices, including static or non-transitory memory devices.

It is to be understood that aspects of the present invention will be described in terms of a given illustrative architecture; however, other architectures, structures, substrate materials and process features and steps can be varied within the scope of aspects of the present invention.

Figure 1:
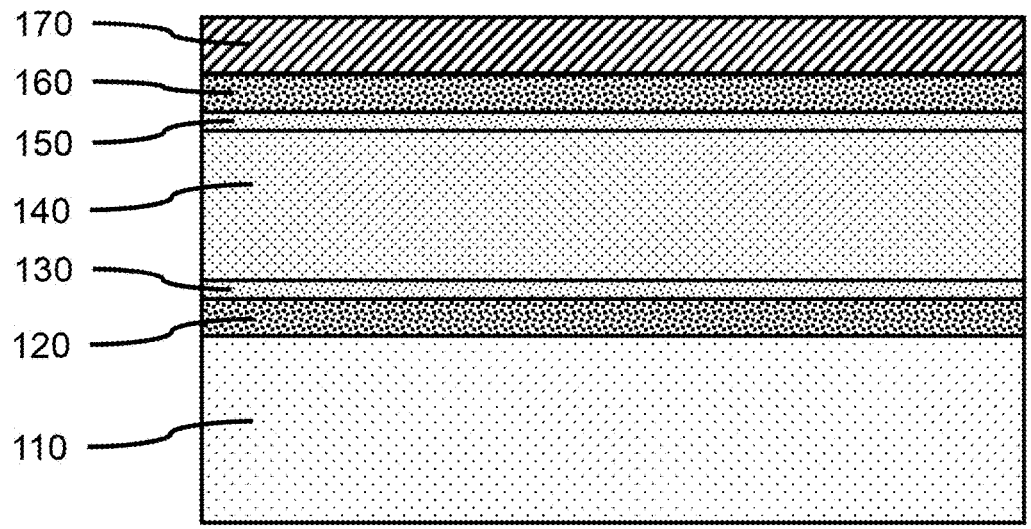
FIG. 1 is a cross-sectional side view along an X-X direction showing a series of layers with metallization layers on the top and bottom of a phase change material layer sandwiched between upper and lower buffer layers, in accordance with an embodiment of the present invention.

Referring now to the drawings in which like numerals represent the same or similar elements and initially to FIG. 1, a cross-sectional side view along an X-X direction showing a series of metallization layers on the top and bottom of a phase change material layer sandwiched between upper and lower buffer layers is shown, in accordance with an embodiment of the present invention In one or more embodiments, a series of metallization layers on the top and bottom of a phase change material layer sandwiched between upper and lower buffer layers can be formed on a substrate 110. A stack of layers including a lower metallization layer 120, a lower buffer layer 130 on the lower metallization layer, a phase change material (PCM) layer 140 on the lower buffer layer, an upper buffer layer 150 on the phase change material layer, and an upper conductive layer 160 on the upper buffer layer 150 can be formed on a substrate 110, where the layers can be formed by deposition processes, for example chemical vapor deposition (CVD), plasma enhanced CVD (PECVD), high pressure CVD (HPCVD), low pressure CVD (LPCVD), etc. A slab template layer 170 can be formed on upper conductive layer 160, where the slab template layer 170 can be a hardmask layer formed by a deposition process.

In one or more embodiments, the substrate 110 can be a semiconductor substrate, including, but not limited to, a type IV semiconductor (e.g., silicon (Si), germanium (Ge)), a IV-IV semiconductor (e.g., silicon-germanium (SiGe), silicon carbide (SiC)), a III-V semiconductor (e.g., gallium arsenide (GaAs), indium phosphide (InP), indium arsenide (InAs), indium gallium arsenide (InGaAs)), a II-VI semiconductor (e.g., zinc selenide (ZnSe), cadmium sulfide (CdS), cadmium telluride (CdTe)), or combinations thereof.

The substrate can be a single crystal semiconductor wafer or semiconductor-on-insulator (SeOI) wafer (e.g., silicon-on-insulator (SOI)).

In various embodiments, one or more active and/or passive device can be fabricated on the substrate 110 before back end of line (BEOL) processing to form metallization layers, vias, and electrical interconnects. The one or more active and/or passive device can include field effect transistor device, complementary-metal-oxide-semiconductor (CMOS) devices, resistors, capacitors, diodes, inductors, etc.

In one or more embodiments, a lower metallization layer 120 can be formed on the substrate 110, where the lower metallization layer 120 can be formed by a deposition process. In various embodiments, the lower metallization layer 120 can be a conductive metal, including, but not limited to, titanium (Ti), tantalum (Ta), tungsten (W), cobalt (Co), molybdenum (Mo), aluminum (Al), copper (Cu), and combinations thereof. The lower metallization layer 120 can be formed by a deposition process, including, but not limited to, physical vapor deposition (PVD), for example, by sputtering or evaporation, electroplating, or a combination thereof.

In various embodiments, the lower metallization layer 120 can have a thickness in the range of about 10 nanometers (nm) to about 80 nm, or about 40 nm to about 60 nm, although other thicknesses are also contemplated.

In one or more embodiments, a lower buffer layer 130 can be formed on the lower metallization layer 120, where the lower buffer layer 130 can be formed by a deposition process. In various embodiments, the lower buffer layer 130 can be carbon (C), a conductive metal compound, including, but not limited to, transition metal nitrides, for example, tantalum nitride (TaN), titanium nitride (TiN), tungsten nitride (WN), transition metal carbides, for example, tantalum carbide (TaC), titanium carbide (TiC), tungsten carbide (WC), and combinations thereof, where the combination can be a multilayer. The lower buffer layer 130 can be a diffusion barrier to the material of the lower metallization layer 120.

In various embodiments, the lower buffer layer 130 can have a thickness in the range of about 5 nanometers (nm) to about 30 nm, or about 10 nm to about 20 nm, although other thicknesses are also contemplated.

In one or more embodiments, a phase change material layer 140 can be formed on the lower buffer layer, where the phase change material layer 140 can be formed by a deposition process, including, but not limited to, PVD sputtering. In various embodiments, the phase change material layer 140 can be germanium-antimony-tellurium (GeSbTe, also (GST)), where the phase change material can include a dopant, for example, nitrogen (N), oxygen (O), gallium (Ga), or a combination thereof, that can be used to tune the GST to have particular properties.

In various embodiments, the phase change material layer 140 can have a thickness in the range of about 10 nm to about 80 nm, or about 20 nm to about 50 nm, although other thicknesses are also contemplated. If the phase change material layer 140 is too thin interface modification may become dominant and significantly modify the material properties.

In one or more embodiments, an upper buffer layer 150 can be formed on the phase change material layer 140, where the upper buffer layer 150 can be formed by a deposition process.

In various embodiments, the upper buffer layer 150 can be carbon (C), a conductive metal compound, including, but not limited to, transition metal nitrides, for example, tantalum nitride (TaN), titanium nitride (TiN), tungsten nitride (WN), transition metal carbides, for example, tantalum carbide (TaC), titanium carbide (TiC), tungsten carbide (WC), and combinations thereof, where the combination can be a multilayer.

In various embodiments, the upper buffer layer 150 can have a thickness in the range of about 5 nm to about 30 nm, or about 10 nm to about 20 nm, although other thicknesses are also contemplated.

In one or more embodiments, an upper conductive layer 160 can be formed on the upper buffer layer 150, where the upper conductive layer 160 can be formed by a deposition process. In various embodiments, the upper conductive layer 160 can be a conductive metal, including, but not limited to, titanium (Ti), tantalum (Ta), tungsten (W), cobalt (Co), molybdenum (Mo), aluminum (Al), copper (Cu), and combinations thereof.

In various embodiments, the upper conductive layer 160 can have a thickness in the range of about 10 nm to about 80 nm, or about 30 nm to about 60 nm, although other thicknesses are also contemplated.

In one or more embodiments, the upper buffer layer 150 and the lower buffer layer 130 can be optional, such that the phase change material layer 140 is directly on the lower metallization layer 120, and the upper conductive layer 160 is directly on the phase change material layer 140.

Figure 2:
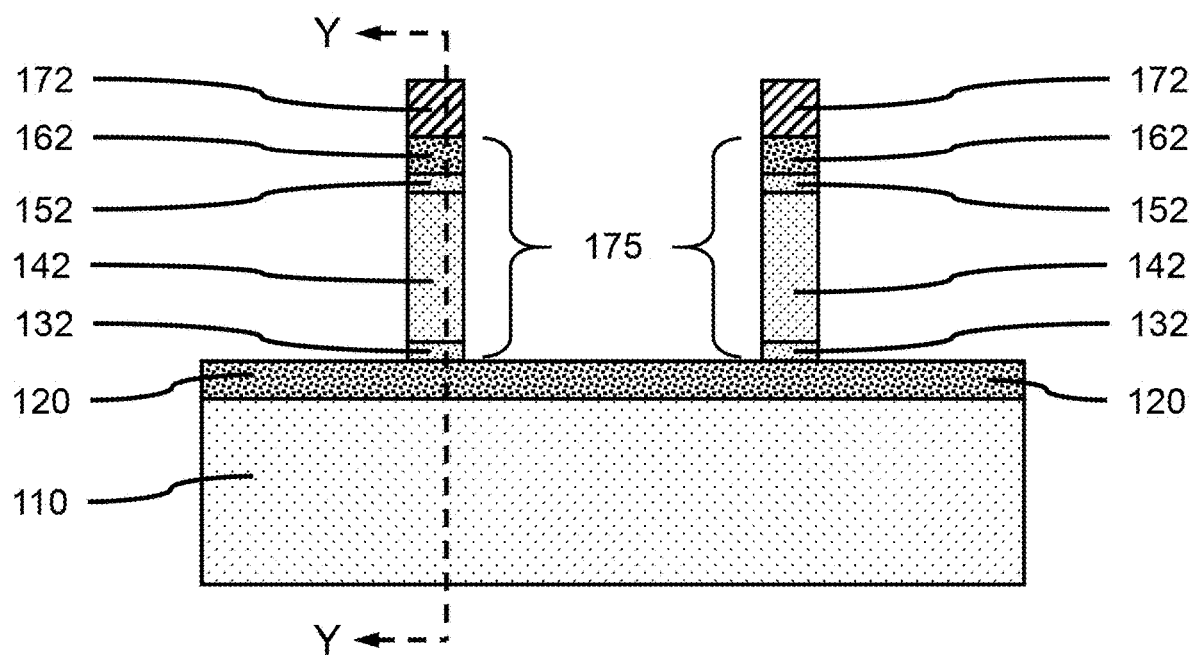
FIG. 2 is a cross-sectional side view along an X-X direction showing a plurality of upright slabs including a lower buffer segment on a lower metallization layer, a phase change material segment on the lower buffer segment, an upper buffer segment on the phase change material segment, and an upper conductive segment on the upper buffer segment, and a slab template on the upright slab, in accordance with an embodiment of the present invention.

In one or more embodiments, a slab template layer 170 can be formed on upper conductive segment 160, where the slab template layer 170 can be a hardmask layer. In various embodiments, the slab template layer 170 can be a dielectric material, including, but not limited to, silicon nitride (SiN), silicon oxide (SiO), silicon oxynitride (SiON), silicon boronitride (SiBN), and combinations thereof FIG. 2 is a cross-sectional side view along an X-X direction showing a plurality of upright slabs including a lower buffer segment on a lower metallization layer, a phase change material segment on the lower buffer segment, an upper buffer segment on the phase change material segment, and an upper conductive segment on the upper buffer segment, and a slab template on the upright slab, in accordance with an embodiment of the present invention.

In one or more embodiments, the slab template layer 170 can be patterned using lithographic methods to form one or more slab template(s) 172. The slab template(s) 172 can be used as a hardmask for removing portions of the underlying layers, where portions of each of the underlying layers can be removed by etching. The etching process can be a selective, directional etch, for example, a reactive ion etch (RIE) to form upright slabs 175 underneath each of the one or more slab template(s) 172 from the stack of layers. The etching may stop at the lower metallization layer 120 to leave the lower metallization layer 120 in tact below the upright slabs.

In various embodiments, an upright slab 175 can include a lower buffer segment 132 on the lower metallization layer 120, a phase change material segment 142 on the lower buffer segment 132, an upper buffer segment 152 on the phase change material segment 142, and an upper conductive segment 162 on the upper buffer segment 152.

Figure 3:
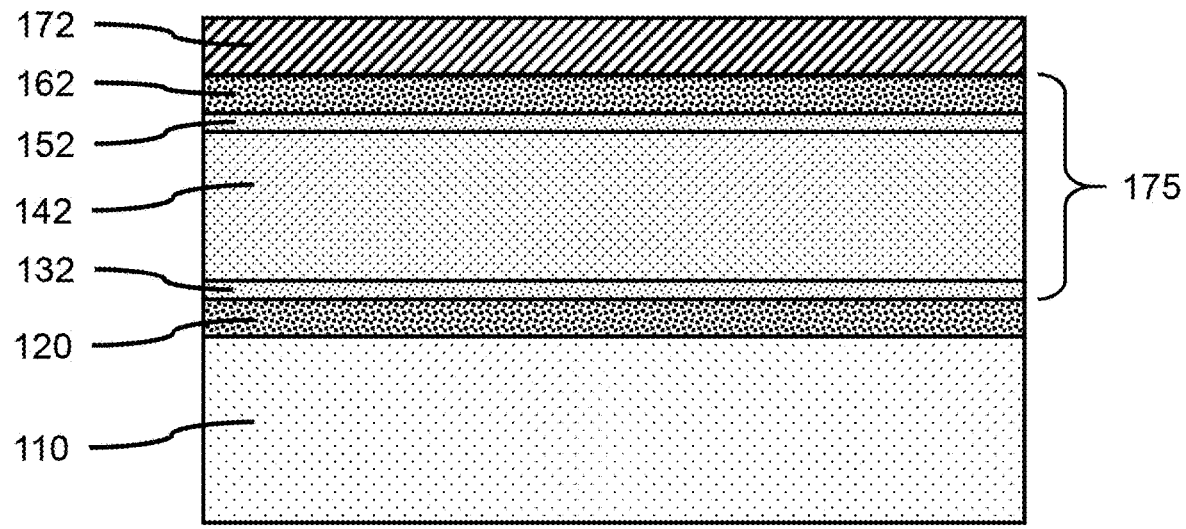
FIG. 3 is a cross-sectional side view along a Y-Y direction perpendicular to the X-X direction showing the lower metallization layer, lower buffer segment, phase change material segment, upper buffer segment, and upper conductive segment of an upright slab, and slab template on the upright slab, in accordance with an embodiment of the present invention.

FIG. 3 is a cross-sectional side view along a Y-Y direction perpendicular to the X-X direction showing the lower metallization layer, lower buffer segment, phase change material segment, upper buffer segment, upper conductive segment of an upright slab, and slab template on the upright slab, in accordance with an embodiment of the present invention.

In one or more embodiments, the upright slap 175 extends across the lower metallization layer 120 and substrate 110 in a long direction where the length of the upright slab is greater than the width. In various embodiments, the lower buffer segment 132, a phase change material segment 142, an upper buffer segment 152, and an upper conductive segment 162 have a width in a range of about 5 nm to about 60 nm, or about 10 nm to about 30 nm, although other widths are also contemplated.

In various embodiments, the upright slabs 175 can have a length in a range of about 10 micrometers (um) to about 500 um, or about 60 um to about 250 um, or about 75 um to about 150 um, or about 150 um to about 250 um, although other lengths are also contemplated. The length of the upright slab can determine the number of memory elements in a block, where a slab of about 150 um can form about 1024 memory elements.

Figure 4:
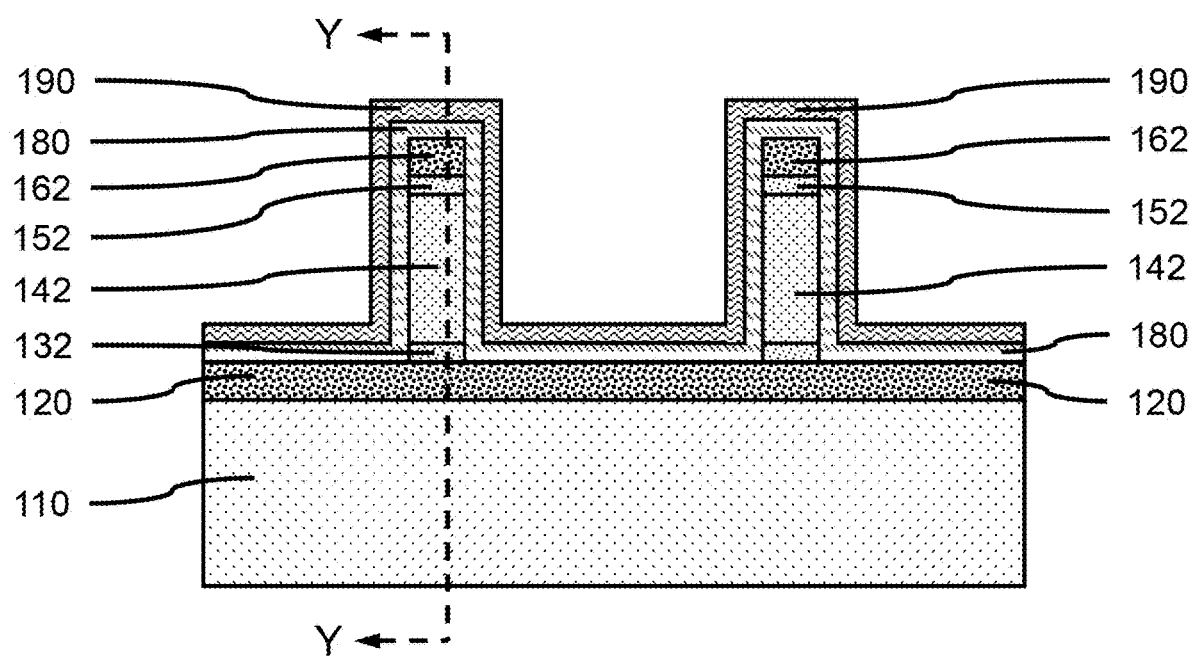
FIG. 4 is a cross-sectional side view along an X-X direction showing a resistive liner on the upright slabs after removing the slab template, and a sidewall spacer layer on the resistive liner, in accordance with an embodiment of the present invention.

FIG. 4 is a cross-sectional side view along an X-X direction showing a resistive liner on the upright slabs after removing the slab template, and a sidewall spacer layer on the resistive liner, in accordance with an embodiment of the present invention.

In one or more embodiments, a resistive liner 180 can be formed on the upright slabs 175 after removing the slab template 172, where the resistive liner 180 can be formed by a conformal deposition, for example, atomic layer deposition (ALD), plasma enhanced ALD (PEALD), low pressure chemical vapor deposition (LPCVD), or a combination thereof. In various embodiments, the resistive liner 180 covers the upright slabs including the top surface of the upper conductive segment 162, the sidewalls of the phase change material segment 142 and the exposed surface of the lower metallization layer 120.

In various embodiments, the resistive liner 180 can be a conductive material, including, but not limited to, tantalum nitride (TaN), tantalum aluminum nitride (TaAlN), tantalum aluminum carbide (TaAlC), titanium nitride (TiN), titanium aluminum nitride (TiAlN), titanium aluminum carbide (TiAlC), carbon nanotubes (CNTs), and combinations thereof. The material of the resistive liner 180 can have a specific resistance in a range of about 500 kOhm/square (sheet resistance) to about 5 MOhm/square at a 1 nm to 10 nm thickness, where the resistive liner 180 can provide a parallel path for current flow through the upright slab. The resistive liner 180 can reduce the resistance drift of the phase change material by having a resistivity value between the resistivity of the PCM in the crystalline state and the resistivity of the PCM in the amorphous state, where the resistive liner 180 provides an alternative path for the current to flow to bypass the PCM in the amorphous state. The PCM in the amorphous state can have the largest resistance drift, so the alternative path can alleviate the drift.

In various embodiments, the resistive liner 180 can have a thickness in the range of about 1 nm to about 10 nm, or about 3 nm to about 6 nm, although other thicknesses are also contemplated. The resistive liner 180 can be sufficiently thin to fit in the gap between upright slabs without filling the gap or electrically shorting.

In one or more embodiments, a sidewall spacer layer 190 can be formed on the resistive liner 180, where the sidewall spacer layer 190 can be formed by a conformal deposition (e.g., ALD, PEALD, LPCVD).

In various embodiments, the sidewall spacer layer 190 can be a dielectric material, including, but not limited to, silicon oxide (SiO), silicon nitride (SiN), silicon oxynitride (SiON), aluminum oxide (AlO), hafnium oxide (HfO), and combinations thereof. The sidewall spacer layer 190 can protect the resistive liner 180 during subsequent processes including conductive line etching.

In various embodiments, the sidewall spacer layer 190 can have a thickness in the range of about 1 nm to about 10 nm, or about 2 nm to about 5 nm, or about 2 nm to about 3 nm, or about 3 nm to about 5 nm, although other thicknesses are also contemplated. The thickness of the sidewall spacer layer 190 can determine a width of a subsequently formed lower metallization layer segment, where a thinner sidewall spacer layer can be used for smaller pitches between the upright slabs due to limited space to subsequently etch the lower metallization layer 120.

In various embodiments, the upright slabs can be separated by a pitch in a range of about 12 nm to about 40 nm, or about 14 nm to about 20 nm, or about 14 nm, although other pitches are also contemplated.

Figure 5:
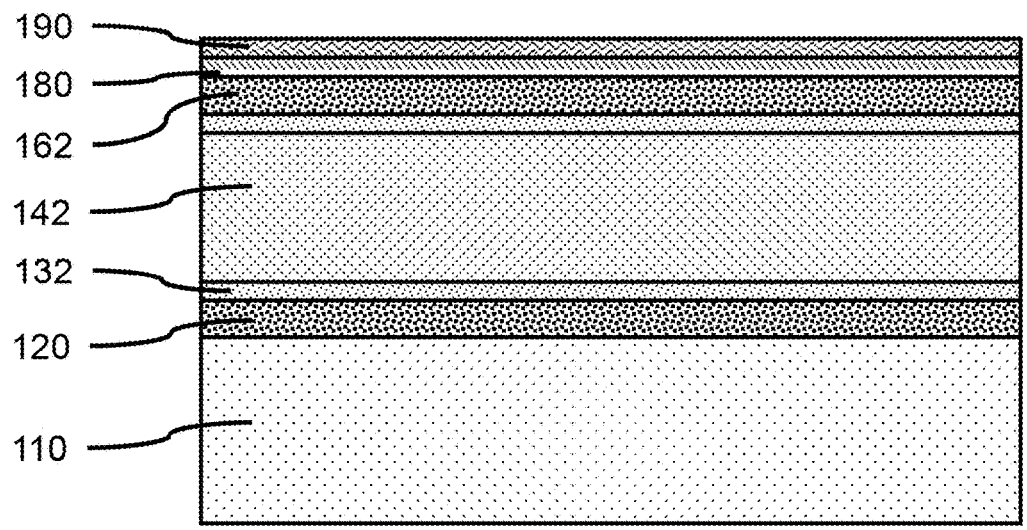
FIG. 5 is a cross-sectional side view along a Y-Y direction perpendicular to the X-X direction showing the resistive liner and sidewall spacer layer along a length of the top of the upright slab, in accordance with an embodiment of the present invention.

FIG. 5 is a cross-sectional side view along a Y-Y direction perpendicular to the X-X direction showing the resistive liner and sidewall spacer layer along a length of the top of the upright slab, in accordance with an embodiment of the present invention.

In one or more embodiments, the resistive liner 180 and sidewall spacer layer 190 extends across the upright slab and top surface of the upper conductive segment 162.

Figure 6:
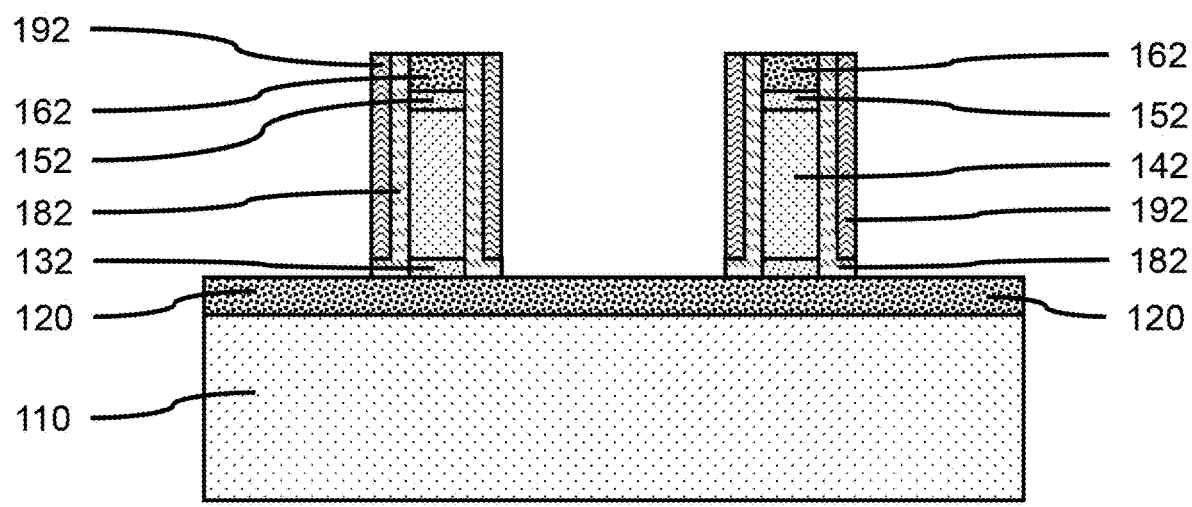
FIG. 6 is a cross-sectional side view along an X-X direction showing a resistive liner segment on the sidewalls of the upright slabs, and a sidewall spacer layer segment on the resistive liner segment, in accordance with an embodiment of the present invention.

FIG. 6 is a cross-sectional side view along an X-X direction showing a resistive liner segment on the sidewalls of the upright slabs, and a sidewall spacer layer segment on the resistive liner segment, in accordance with an embodiment of the present invention.

In one or more embodiments, portions of the sidewall spacer layer 190 can be removed from the top of the upright slabs and gap between adjacent upright slabs to expose the underlying resistive liner 180, where the removal of portions of the sidewall spacer layer 190 forms sidewall spacer layer segments 192 on the upright slabs. The portions of the sidewall spacer layer 190 can be removed using a selective directional etch (e.g., RIE).

In one or more embodiments, portions of the resistive liner 180 exposed by removal of portions of the sidewall spacer layer 190 can also be removed using a selective directional etch (e.g., RIE) to form resistive liner segments 182 on the sidewalls of the phase change material segment 142, upper buffer segment 152, and upper conductive segment 162. Removal of the portions of the resistive liner 180 can expose the underlying portions of the lower metallization layer 120. A portion of the resistive liner 180 masked by the sidewall spacer layer 190 can remain on the lower metallization layer 120 adjacent to the lower buffer segment 132, where the portion of the resistive liner 180 is between the sidewall spacer layer segments 192 and the lower metallization layer 120.

Figure 7:
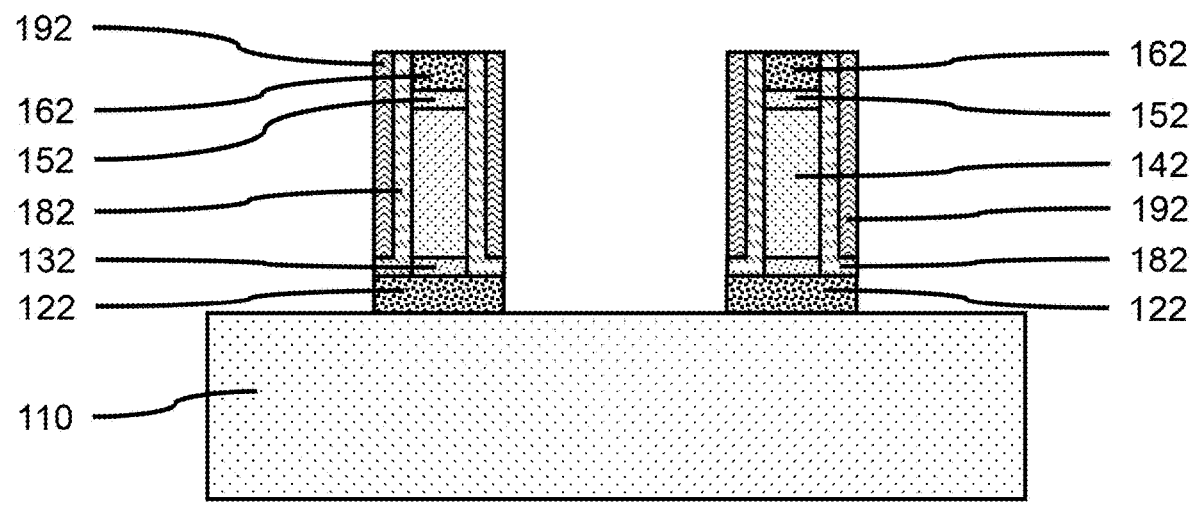
FIG. 7 is a cross-sectional side view along an X-X direction showing the lower metallization layer patterned using the resistive liner segment and the sidewall spacer layer segment as a mask, in accordance with an embodiment of the present invention.

FIG. 7 is a cross-sectional side view along an X-X direction showing the lower metallization layer patterned using the resistive liner segment and the sidewall spacer layer segment as a mask, in accordance with an embodiment of the present invention.

In one or more embodiments, the lower metallization layer 120 can be patterned using the resistive liner segment 182 and the sidewall spacer layer segment 192 as a mask. In various embodiments, the exposed portions of the lower metallization layer 120 can be removed using a selective, directional etch (e.g., RIE) to form a lower metallization layer segment 122 under the upright slab. The width of the lower metallization layer segment 122 can be greater than the width of the upright slab, where the greater width can be determined by the thicknesses of the resistive liner segment 182 and the sidewall spacer layer segment 192. The greater width of the lower metallization layer segment 122 can provide a tolerance for subsequent etchings.

In various embodiments, the lower metallization layer segment 122 can have a width in the range of about 5 nm to about 60 nm, or about 10 nm to about 30 nm, although other widths are also contemplated. The lower metallization layer segment 122 can be in electrical contact with the resistive liner segment 182.

Figure 8:
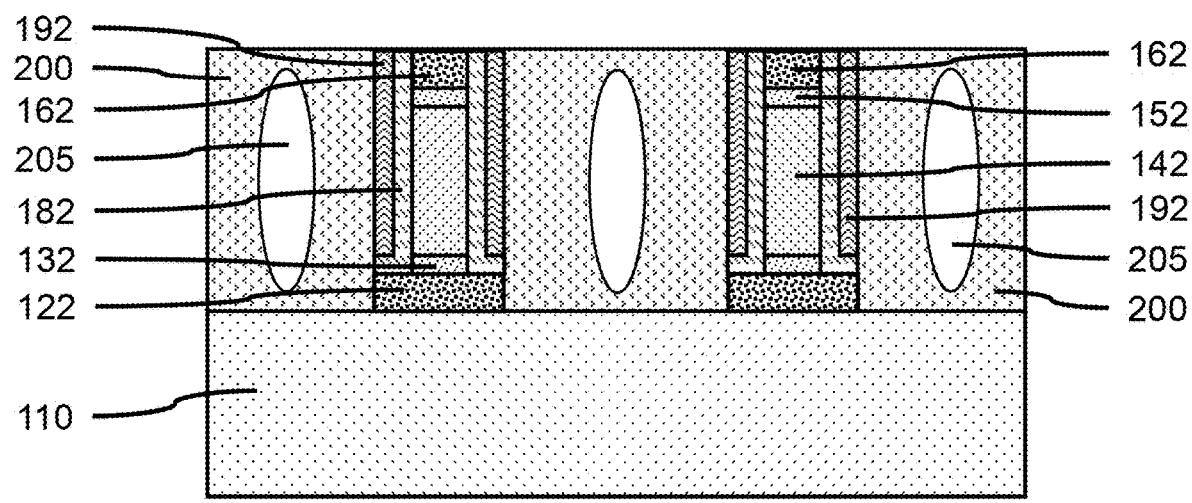
FIG. 8 is a cross-sectional side view along an X-X direction showing a fill layer with airgaps formed between adjacent pairs of the plurality of upright slabs, in accordance with an embodiment of the present invention.

FIG. 8 is a cross-sectional side view along an X-X direction showing a fill layer with airgaps formed between adjacent pairs of the plurality of upright slabs, in accordance with an embodiment of the present invention.

In one or more embodiments, a fill layer 200 can be formed in the gaps between the sidewall spacer layer segments 192 on adjacent upright slabs, where the fill layer 200 can be a dielectric material, including, but not limited to, silicon oxide (SiO), silicon nitride (SiN), silicon oxynitride (SiON), and low-k dielectric materials, for example fluorine or carbon doped silicon oxide (SiO:F, SiO:C), and combinations thereof. The fill layer 200 can be formed by a blanket deposition, for example chemical vapor deposition (CVD), plasma enhanced CVD (PECVD), high pressure CVD (HP-CVD), where the blanket deposition can form airgaps 205 in the fill layer 200 due to pinch-off during the deposition process, and depending on the width of the gaps between the sidewall spacer layer segments 192 on adjacent upright slabs.

Figure 9:
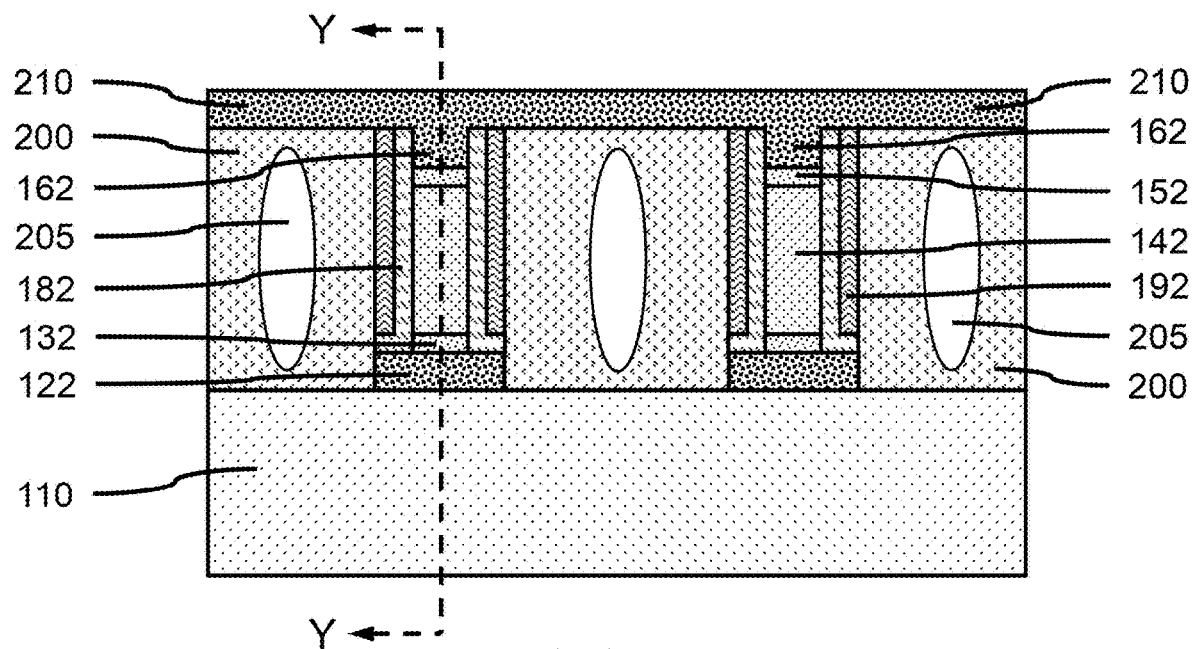
FIG. 9 is a cross-sectional side view along an X-X direction showing an upper metallization layer on the fill layer, resistive liner segment, sidewall spacer layer segment, and upper conductive segment of the upright slabs, in accordance with an embodiment of the present invention.

FIG. 9 is a cross-sectional side view along an X-X direction showing an upper metallization layer on the fill layer, resistive liner segment, sidewall spacer layer segment, and upper conductive segment of the upright slabs, in accordance with an embodiment of the present invention.

In one or more embodiments, an upper metallization layer 210 can be formed on the fill layer 200, resistive liner segment 182, sidewall spacer layer segment 192, and upper conductive segment 162 of the upright slabs, where the upper metallization layer 210 can be formed by a blanket deposition. The upper metallization layer 210 can cover the exposed surfaces. In various embodiments, the upper metallization layer 210 can be a conductive metal, including, but not limited to, titanium (Ti), tantalum (Ta), tungsten (W), cobalt (Co), molybdenum (Mo), aluminum (Al), copper (Cu), and combinations thereof. The upper metallization layer 210 can be a different conductive metal from the lower metallization layer 120. The upper metallization layer 210 can be formed by a deposition process, including, but not limited to, physical vapor deposition (PVD), for example, by sputtering or evaporation, electroplating, or a combination thereof.

In various embodiments, the upper metallization layer 210 can have a thickness in the range of about 10 nanometers (nm) to about 80 nm, or about 30 nm to about 60 nm, although other thicknesses are also contemplated.

Figure 10:
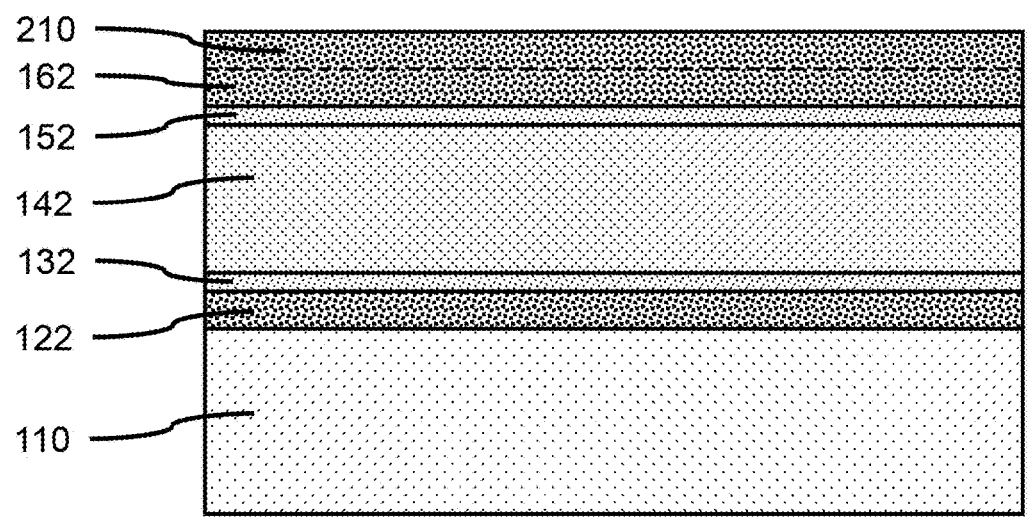
FIG. 10 is a cross-sectional side view along a Y-Y direction perpendicular to the X-X direction showing the upper metallization layer on the upper conductive segment along a length of the top of the upright slab, in accordance with an embodiment of the present invention.

FIG. 10 is a cross-sectional side view along a Y-Y direction perpendicular to the X-X direction showing the upper metallization layer on the upper conductive segment along a length of the top of the upright slab, in accordance with an embodiment of the present invention.

In one or more embodiments, the upper metallization layer 210 can be on the upper conductive segment 162 along a length of the top of the upright slab.

Figure 11:
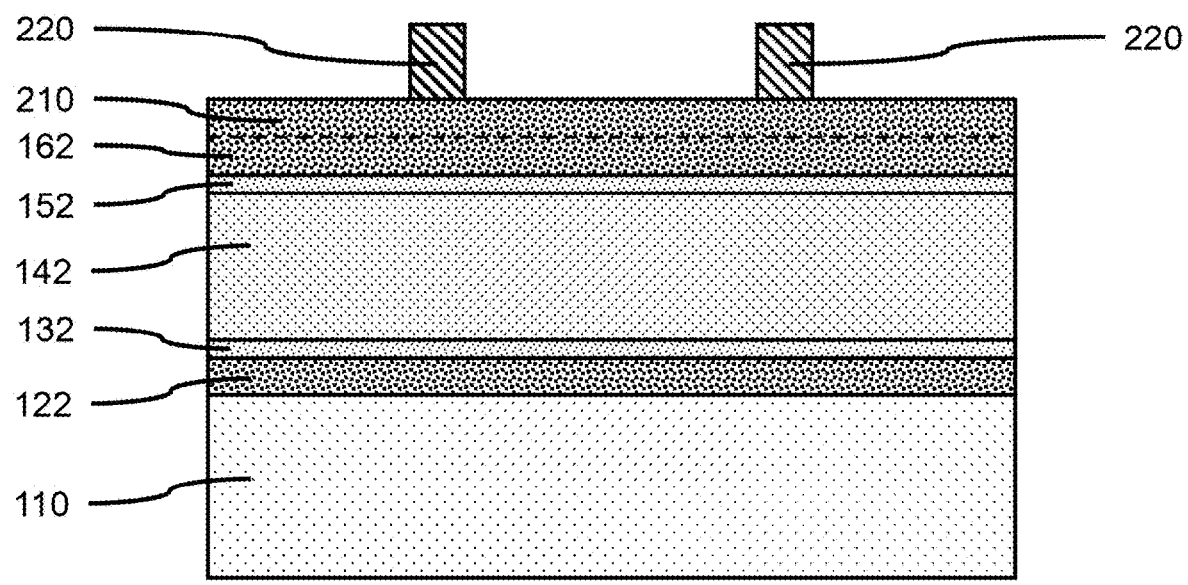
FIG. 11 is a cross-sectional side view along a Y-Y direction perpendicular to the X-X direction showing a plurality of cross templates on the upper metallization layer, in accordance with an embodiment of the present invention.

FIG. 11 is a cross-sectional side view along a Y-Y direction perpendicular to the X-X direction showing a plurality of cross templates on the upper metallization layer, in accordance with an embodiment of the present invention.

In one or more embodiments, a plurality of cross templates 220 can be formed on the upper metallization layer 210, where the plurality of cross templates 220 can be a hardmask patterned using lithographic processes. The cross templates 220 can be essentially perpendicular to the long direction of the upright slabs.

Figure 12:
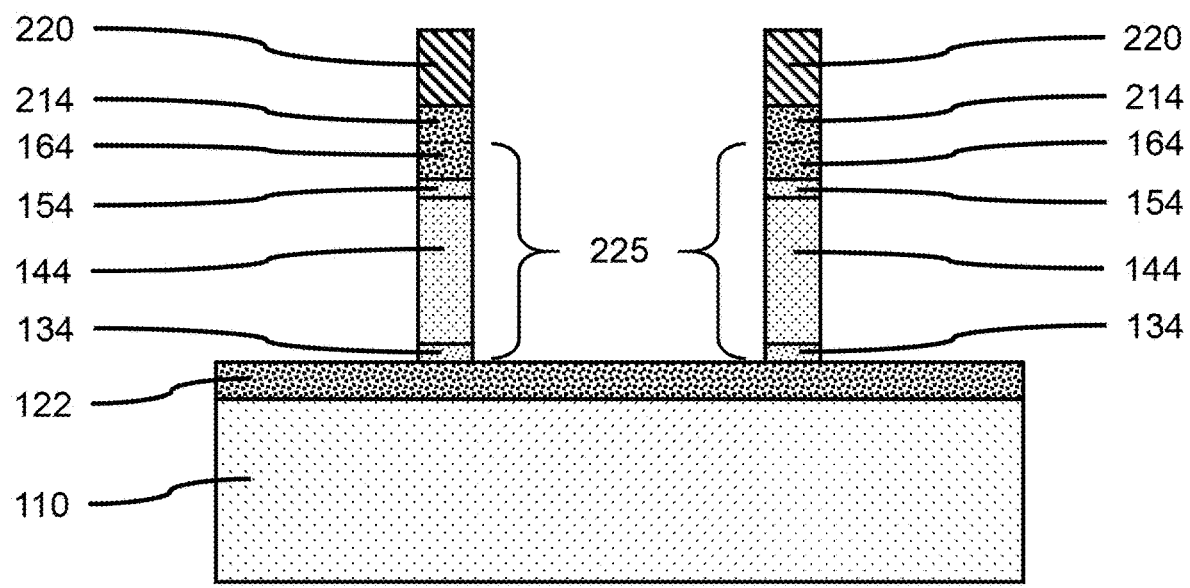
FIG. 12 is a cross-sectional side view along a Y-Y direction perpendicular to the X-X direction showing the upright slab sectioned into upright columns, in accordance with an embodiment of the present invention.

FIG. 12 is a cross-sectional side view along a Y-Y direction perpendicular to the X-X direction showing the upright slab sectioned into upright columns, in accordance with an embodiment of the present invention.

In one or more embodiments, the upright slabs can be sectioned into upright columns using a directional etch (e.g., RIE) to remove the layers of the upright slabs crossed with the cross templates 220 masking the upright slabs. In various embodiments, an upright column 225 can include a lower buffer plate 134 on the lower metallization layer 120, a phase change material block 144 on the lower buffer plate 134, an upper buffer plate 154 on the phase change material block 144, and an upper conductive plate 164 on the upper buffer plate 154.

In various embodiments, upright columns can be essentially square with a width of about 7 nm to about 60 nm, or about 15 nm to about 50 nm, or about 7 nm to about 15 nm, although other widths are contemplated.

In various embodiments, the cross templates 220 can be removed to expose the top surface of the upper metallization layer segment 214 essentially perpendicular to the lower metallization layer segment 122 to form a cross-point array.

Figure 13:
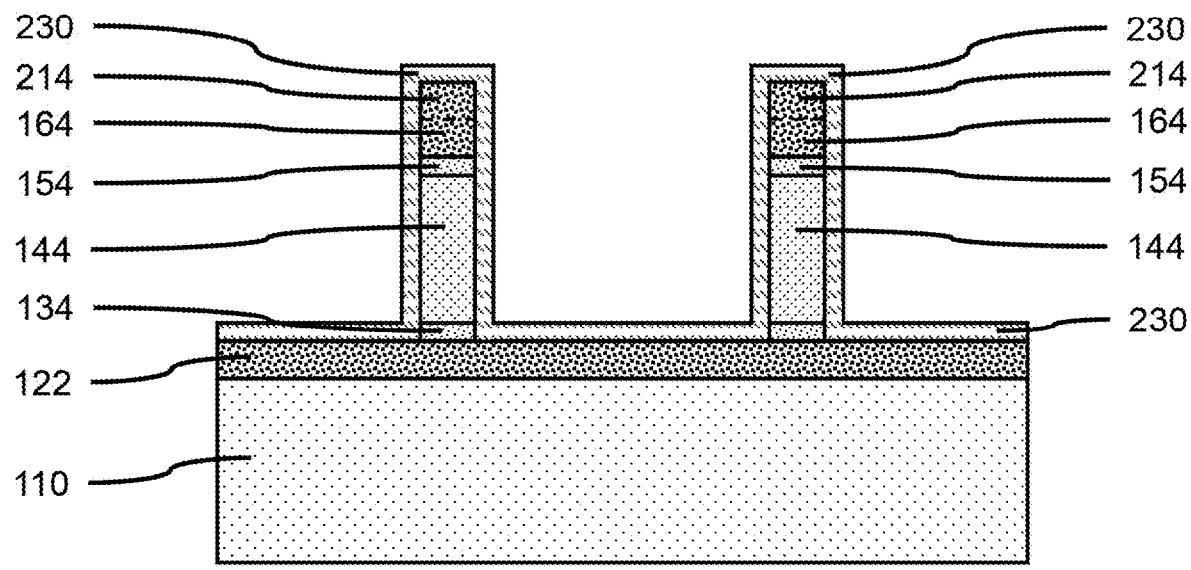
FIG. 13 is a cross-sectional side view along a Y-Y direction perpendicular to the X-X direction showing a second resistive liner formed on the upright columns and lower metallization layer segment, in accordance with an embodiment of the present invention.

FIG. 13 is a cross-sectional side view along a Y-Y direction perpendicular to the X-X direction showing a second resistive liner formed on the upright columns and lower metallization layer segment, in accordance with an embodiment of the present invention.

In one or more embodiments, a second resistive liner 230 can be formed on the upright columns and lower metallization layer segment 122, where the second resistive liner 230 can be formed by a conformal deposition. The second resistive liner 230 can cover the sidewalls of the phase change material block 144, lower buffer plate 134, upper buffer plate 154, and upper conductive plate 164 not covered by resistive liner segments 182.

Figure 14:
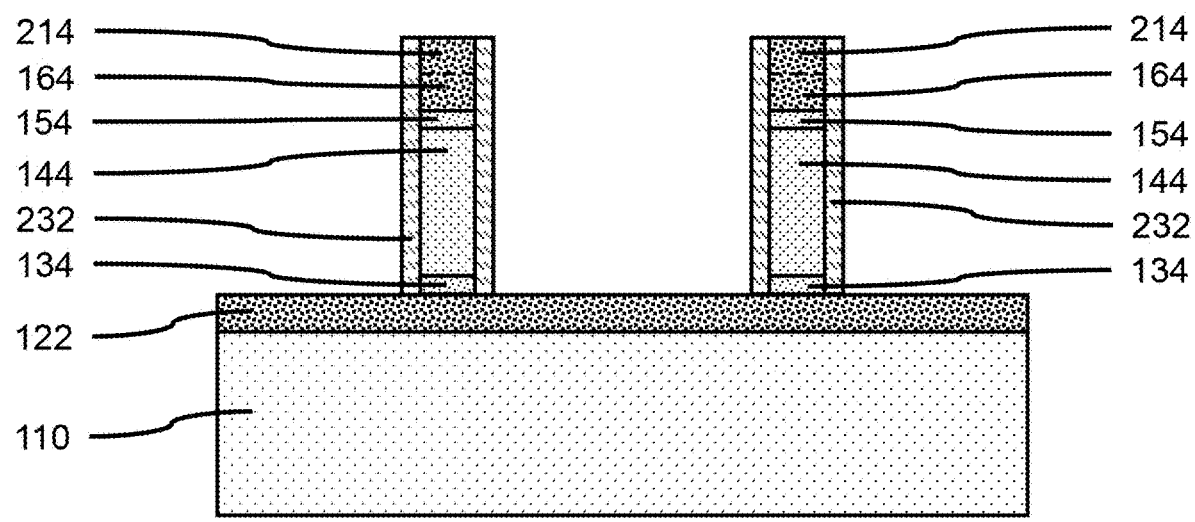
FIG. 14 is a cross-sectional side view along a Y-Y direction perpendicular to the X-X direction showing portions of the second resistive liner removed from the upper metallization layer segments and lower metallization layer segment, in accordance with an embodiment of the present invention.

FIG. 14 is a cross-sectional side view along a Y-Y direction perpendicular to the X-X direction showing portions of the second resistive liner removed from the upper metallization layer segments and lower metallization layer segments, in accordance with an embodiment of the present invention.

In one or more embodiments, portions of the second resistive liner 230 can be removed from the upper metallization layer segments 214 and lower metallization layer segments 122 using a selective, directional etch (e.g., RIE) to expose the underlying lower metallization layer segments 122. Removal of the portions of the second resistive liner 230 can leave second resistive liner segments 232 on opposite sidewalls of the upright columns.

Figure 15:
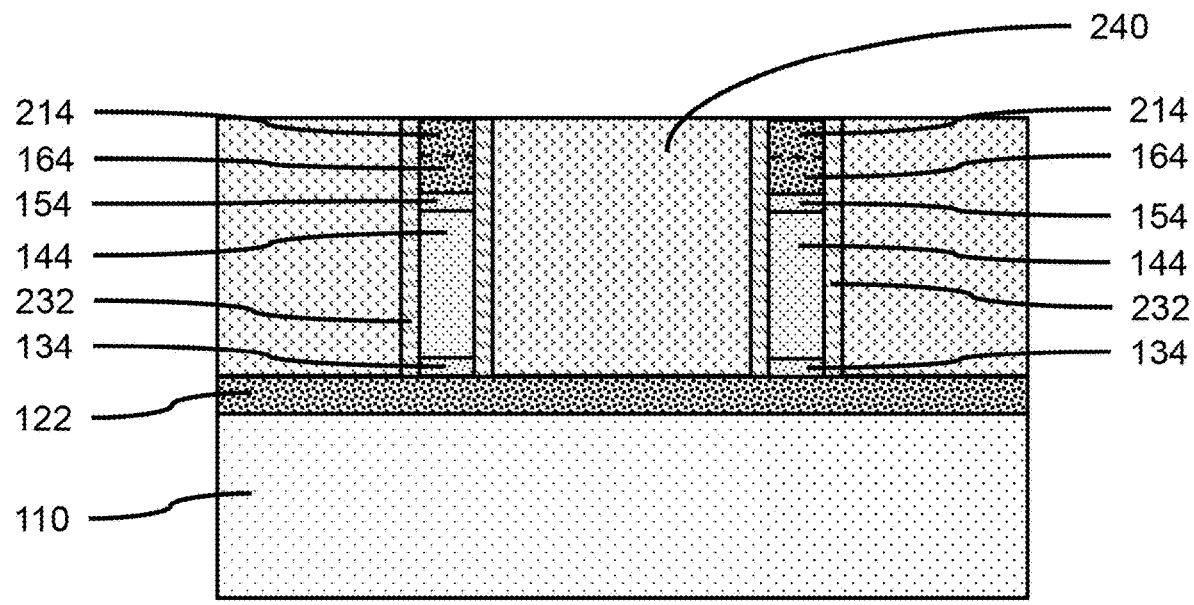
FIG. 15 is a cross-sectional side view along a Y-Y direction perpendicular to the X-X direction showing a fill layer without air gaps formed between the upright columns, in accordance with an embodiment of the present invention.

FIG. 15 is a cross-sectional side view along a Y-Y direction perpendicular to the X-X direction showing a fill layer without air gaps can be formed between the upright columns, in accordance with an embodiment of the present invention.

In one or more embodiments, a second fill layer 240 without air gaps can be formed between the upright columns.

Figure 16:
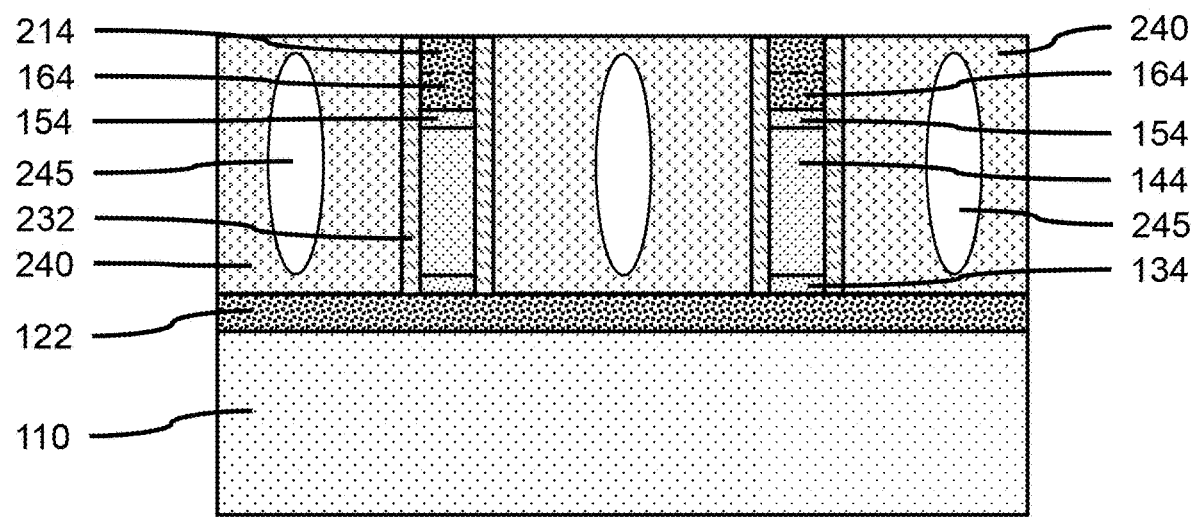
FIG. 16 is a cross-sectional side view along a Y-Y direction perpendicular to the X-X direction showing a fill layer with airgaps formed between the upright columns, in accordance with an embodiment of the present invention.

FIG. 16 is a cross-sectional side view along a Y-Y direction perpendicular to the X-X direction showing a fill layer with airgaps formed between the upright columns, in accordance with an embodiment of the present invention.

In one or more embodiments, a second fill layer 240 with air gaps 245 can be formed between the upright columns.

Figure 17:
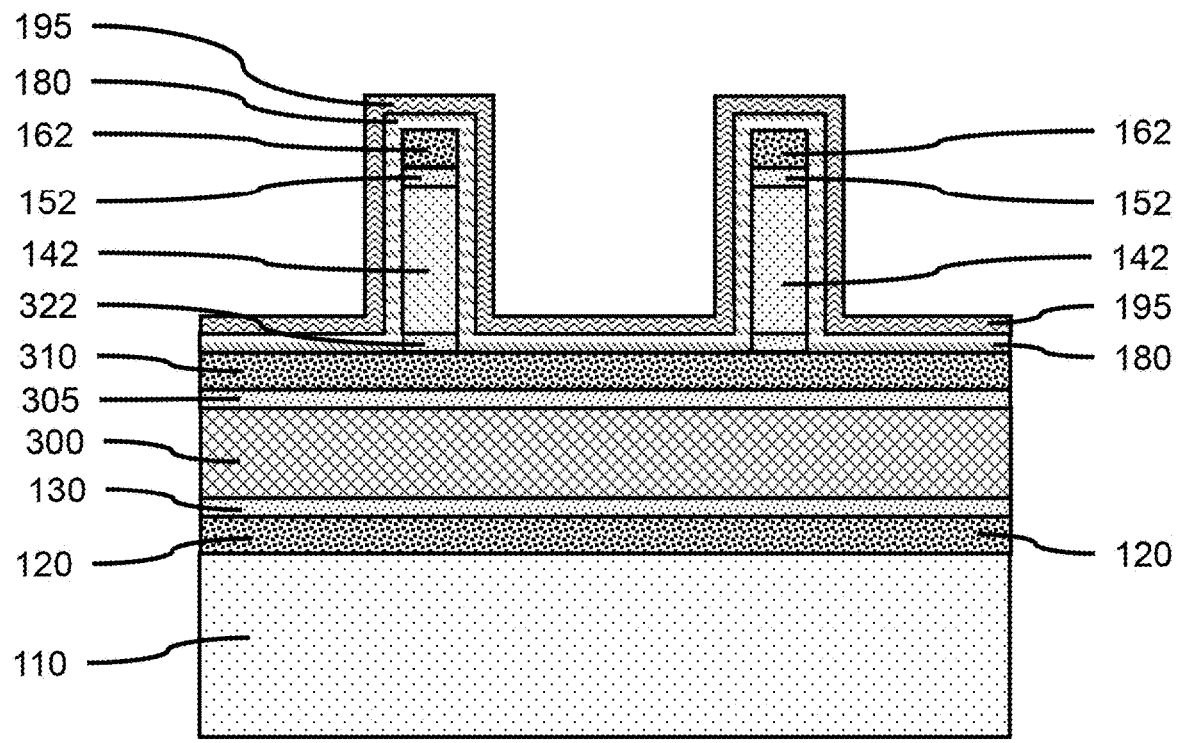
FIG. 17 is a cross-sectional side view along an X-X direction showing a resistive liner and inner spacer layer on a plurality of upright slabs, including, a second intermediate buffer layer on the middle conductive layer, a phase change material layer on the second intermediate buffer layer, an upper buffer layer on the phase change material layer, and an upper conductive layer on the upper buffer layer, in accordance with an embodiment of the present invention.

FIG. 17 is a cross-sectional side view along an X-X direction showing a resistive liner and inner spacer layer on a plurality of upright slabs, including, a second intermediate buffer layer on the middle conductive layer, a phase change material layer on the second intermediate buffer layer, an upper buffer layer on the phase change material layer, and an upper conductive layer on the upper buffer layer, in accordance with an embodiment of the present invention.

In one or more embodiments, there can be a lower metallization layer, a lower buffer layer on the lower metallization layer, a selector material layer on the lower buffer layer, a first intermediate buffer layer on the selector material layer, a middle conductive layer on the first intermediate buffer layer, a second intermediate buffer layer on the middle conductive layer, a phase change material layer on the second intermediate buffer layer, an upper buffer layer on the phase change material layer, an upper conductive layer on the upper buffer layer, and a slab template layer on the upper conductive layer, in accordance with another embodiment of the present invention.

In one or more embodiments, a series of layers can be formed on a substrate 110. A stack of layers including a lower metallization layer 120, a lower buffer layer 130 on the lower metallization layer, a selector material layer 300 on the lower buffer layer 130, a first intermediate buffer layer 305 on the selector material layer 300, a middle conductive layer 310 on the first intermediate buffer layer 305, a second intermediate buffer layer on the middle conductive layer 310, a phase change material (PCM) layer 140 on the second intermediate buffer layer, an upper buffer layer 150 on the phase change material layer 140, and an upper conductive layer 160 on the upper buffer layer 150 can be formed on a substrate 110, where each of the layers can be formed by a deposition process. A slab template layer 170 can be formed on upper conductive segment 160, where the slab template layer 170 can be a hardmask layer formed by a deposition process.

In one or more embodiments, a selector material layer 300 can be formed on the lower buffer layer 130. The selector material layer 300 can be a chalcogenide glass or alloy, where the chalcogenide glass or alloy can include sulfur (S), selenium (Se), tellurium (Te), arsenic (As), nitrogen (N), germanium (Ge), silicon (Si), and combinations thereof, for example, $As_2S_3$, $As_2Se_3$, $As_2Te_3$, SiGeAsSe, AsGeSiN, AsSeTeS, etc. The chalcogenide glass or alloy composition can have a group VI element as the majority of the composition. The selector material layer 300 can be an ovonic threshold switch that can toggle between an "on" state and an "off" state, where the material resistivity changes depending on the amount of voltage applied. In various embodiments, once a threshold current or voltage is reached, the "on" state is triggered, where the ovonic threshold switch (OTS) can be in a substantially conductive state. A change in the applied voltage or current can change the OTS back to an "off" state having a higher resistance than the "on" state.

In various embodiments, the lower buffer layer 130, first intermediate buffer layer 305, second intermediate buffer layer, and upper buffer layer 150 can be carbon (C), a conductive metal compound, including, but not limited to, transition metal nitrides, for example, tantalum nitride (TaN), titanium nitride (TiN), tungsten nitride (WN), transition metal carbides, for example, tantalum carbide (TaC), titanium carbide (TiC), tungsten carbide (WC), and combinations thereof, where the combination can be a multilayer.

In various embodiments, the lower buffer layer 130, first intermediate buffer layer 305, second intermediate buffer layer, and upper buffer layer 150 can each have a thickness in the range of about 5 nanometers (nm) to about 30 nm, or about 10 nm to about 20 nm, although other thicknesses are also contemplated. The buffer layers can avoid diffusion of elements between layers.

In one or more embodiments, an upright slab can include, a second intermediate buffer segment 322 on a middle conductive layer 310, a phase change material segment 142 on the second intermediate buffer segment 322, an upper buffer segment 152 on the phase change material segment 142, and an upper conductive segment 162 on the upper buffer segment 152. In various embodiments, a first intermediate buffer layer 305 can be disposed between the middle conductive layer 310 and the selector material layer 300, or the middle conductive layer 310 and/or first intermediate buffer layer 305 can be excluded.

In one or more embodiments, a resistive liner 180 can be formed on the upright slabs after removing the slab template, where the resistive liner 180 can be formed by a conformal deposition (e.g., ALD, PEALD, LPCVD). In one or more embodiments, an inner spacer layer 195 can be formed on the resistive liner 180, where the inner spacer layer 195 can be formed by a conformal deposition (e.g., ALD, PEALD, LPCVD). The inner spacer layer can be similar to the sidewall spacer layer 190.

In one or more embodiments, there can be a resistive liner segment on the sidewalls of the upright slabs and the middle conductive layer, and an inner spacer layer segment on the resistive liner segment, in accordance with an embodiment of the present invention.

In one or more embodiments, portions of the inner spacer layer 195 can be removed from the top of the upright slabs and the gap between adjacent upright slabs to expose the underlying resistive liner 180, where the removal of portions of the inner spacer layer 195 forms inner spacer layer segments 196 on the resistive liner 180 and upright slabs. The exposed portions of the resistive liner 180 can be removed to form resistive liner segments 182 on the sidewalls of the phase change material segment 142. The underlying middle conductive layer 310 and upper conductive segment 162 can be exposed by the removal of the portions of the resistive liner 180 and inner spacer layer.

In various embodiments, the inner spacer layer 195 can be a dielectric material, including, but not limited to, silicon oxide (SiO), silicon nitride (SiN), silicon oxynitride (SiON), aluminum oxide (AlO), hafnium oxide (HfO), and combinations thereof. The inner spacer layer 195 can protect the resistive liner 180 during subsequent processes including conductive line etching.

In various embodiments, the inner spacer layer 195 can have a thickness in the range of about 1 nm to about 10 nm, or about 2 nm to about 5 nm, or about 2 nm to about 3 nm, or about 3 nm to about 5 nm, although other thicknesses are also contemplated. The thickness of the inner spacer layer 195 can determine a width of a subsequently formed middle conductive layer segment, where a thinner inner spacer layer can be used for smaller pitches between the upright slabs due to limited space to subsequently etch the middle conductive layer 310 and underlying layers.

Figure 18:
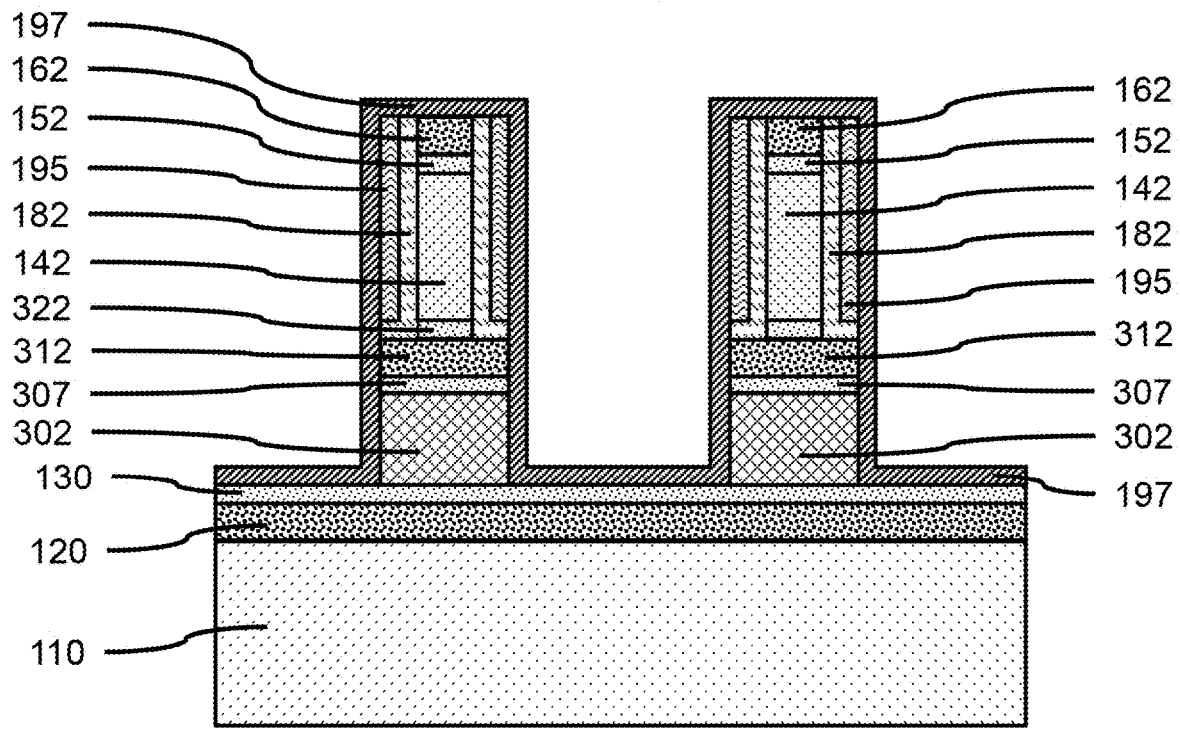
FIG. 18 is a cross-sectional side view along an X-X direction showing an outer spacer layer formed on the inner spacer layer segment and the resistive liner segment after patterning the middle conductive layer, first intermediate buffer layer, and selector material layer, in accordance with an embodiment of the present invention

FIG. 18 is a cross-sectional side view along an X-X direction showing an outer spacer layer formed on the inner spacer layer segment and the resistive liner segment after patterning the middle conductive layer, first intermediate buffer layer, and selector material layer, in accordance with an embodiment of the present invention.

In one or more embodiments, the middle conductive layer 310, first intermediate buffer layer 305, and selector material layer 300 can be patterned using the inner spacer layer segments 196 as a mask to determine the width of middle conductive layer segment 312, first intermediate buffer segment 307, and selector material layer segment 302. The layers can be etched using RIE.

In one or more embodiments, an outer spacer layer 197 can be formed on the inner spacer layer segments 196, middle conductive layer segment 312, first intermediate buffer segment 307, selector material layer segment 302, and exposed surface of the lower buffer layer 130 using a conformal deposition. In various embodiments, the outer spacer layer 197 can be a dielectric material, including, but not limited to, silicon oxide (SiO), silicon nitride (SiN), silicon oxynitride (SiON), aluminum oxide (AlO), hafnium oxide (HfO), and combinations thereof. The outer spacer layer 197 can be a different material from the inner spacer layer 195 to provide etch selectivity.

In one or more embodiments, there can be an outer spacer layer segment on the inner spacer layer segment, resistive liner segment, and patterned selector material layer segment, with the patterned selector material layer segment on a lower buffer layer segment and lower metallization layer segment, in accordance with an embodiment of the present invention.

In one or more embodiments, portions of the outer spacer layer 197 can be removed using a directional etch (e.g., RIE) to form outer spacer layer segments 198 on the inner spacer layer segments 196, middle conductive layer segment 312, first intermediate buffer segment 307, and selector material layer segment 302.

In one or more embodiments, the lower buffer layer 130 and lower metallization layer 120 can be patterned using a directional etch (e.g., RIE) and the outer spacer layer segments 198 as a mask.

Figure 19:
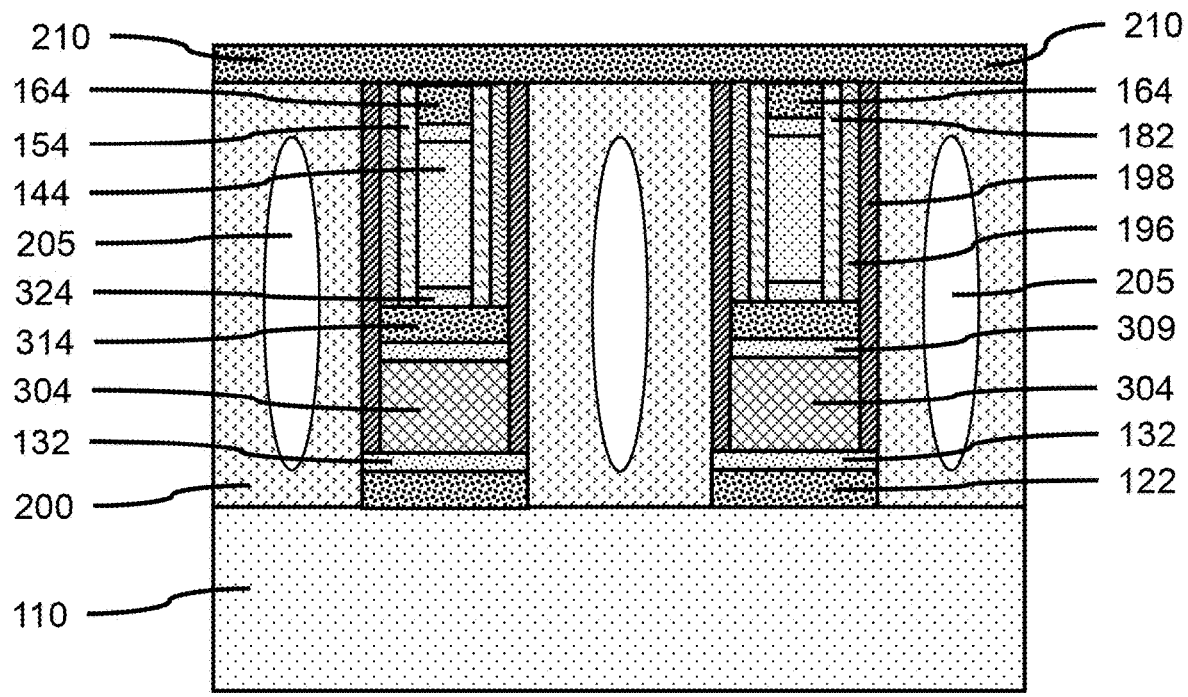
FIG. 19 is a cross-sectional side view along the X-X direction showing a fill layer with airgaps formed between the upright columns, and an upper metallization layer on the fill layer, resistive liner segment, inner and outer spacer layer segments, and upper conductive segment of the upright columns, in accordance with an embodiment of the present invention.

FIG. 19 is a cross-sectional side view along the X-X direction showing a fill layer with airgaps formed between the upright columns, and an upper metallization layer on the fill layer, resistive liner segment, inner and outer spacer layer segments, and upper conductive segment of the upright columns, in accordance with an embodiment of the present invention.

In one or more embodiments, the upright slabs can be patterned using a plurality of cross templates, where the upright slabs can be sectioned into upright columns. In various embodiments, the second intermediate buffer segment 322 can be patterned to form a second intermediate buffer plate 324 on a middle conductive layer segment 312. The middle conductive layer segment 312 can be on a patterned first intermediate buffer segment 307. The phase change material segment 142 can be sectioned to form a phase change material block 144 on the second intermediate buffer plate 324, and the upper buffer segment 152 can be sectioned into an upper buffer plate 154. The upper conductive segment 162 can be sectioned into an upper conductive plate 164 on the upper buffer plate 154.

In one or more embodiments, the middle conductive layer 310 can be sectioned into a middle conductive plate 314. The first intermediate buffer segment 307 can be sectioned into a first intermediate buffer plate 309.

In one or more embodiments, the selector material layer segment 302 can be sectioned to form a selector material block 304 on the lower buffer segment 132, where the lower buffer segment 132 can run approximately perpendicular to the upper metallization layer 210.

In one or more embodiments, a fill layer with airgaps formed between the upright columns.

Figure 20:
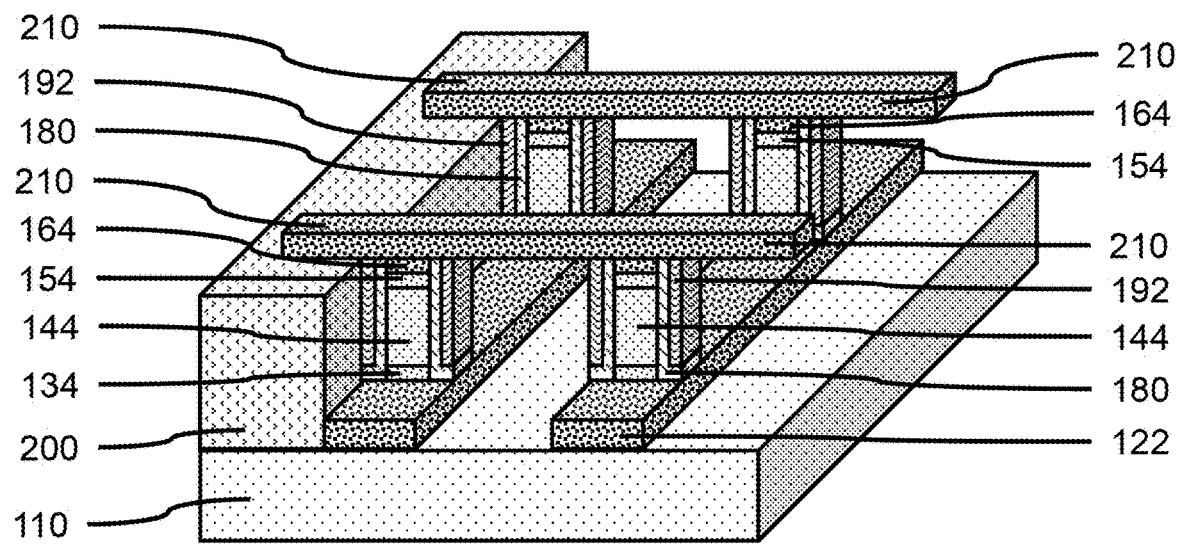
FIG. 20 is a cut-away orthographic view of an array of upright columns on a lower metallization layer segment, in accordance with an embodiment of the present invention.

FIG. 20 is a cut-away orthographic view of an array of upright columns on a lower metallization layer segment, in accordance with an embodiment of the present invention.

In one or more embodiments, the upper metallization layer(s) 210 can run approximately perpendicular to the lower metallization layer segment(s) 122. The upright columns with the phase change material block 144 can be disposed between the upper metallization layer(s) 210 and the lower metallization layer segment(s) 122. In various embodiments, the selector material block 304 can be disposed between the phase change material block 144 and the lower metallization layer segment 122. A first intermediate buffer plate 309, middle conductive plate 314, and second intermediate buffer plate 324 can be between the phase change material block 144 and the selector material block 304.

In one or more embodiments, a fill layer 200 can be formed in the gaps between the upright slabs and upright columns, where the fill layer 200 can have airgaps 205.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a phase change material memory array, comprising:
    forming a lower metallization layer on a substrate;
    forming a plurality of upright slabs, where each of the slabs includes a lower buffer segment on the lower metallization layer, a phase change material segment on the lower buffer segment, an upper buffer segment on the phase change material segment, and an upper conductive segment on the upper buffer segment;
    forming a resistive liner on the plurality of upright slabs;
    forming a sidewall spacer layer on the resistive liner; and
    removing portions of the sidewall spacer layer and the resistive liner on the substrate and the upper conductive segment, wherein another portion of the resistive liner remains on the phase change material segment.

2. The method of claim 1, further comprising forming a fill layer in one or more spaces between adjacent pairs of the plurality of upright slabs.

3. The method of claim 2, further comprising forming an upper metallization layer on the upper conductive segment of each of the plurality of upright slabs and on the fill layer between the upright slabs.

4. The method of claim 3, further comprising sectioning the he upright slabs into upright columns.

5. The method of claim 4, further comprising forming a second resistive liner on the upright columns and lower metallization layer segment.

6. The method of claim 5, further comprising removing the portions of the second resistive liner on the lower metallization layer segment and the upper metallization layer segment, wherein another portion of the second resistive liner remains on the phase change material segment.

7. The method of claim 6, further comprising forming a second fill layer between the upright columns.

8. The method of claim 7, wherein the phase change material segment is germanium-antimony-tellurium (GeSbTe).

9. The method of claim 8, wherein the material of the phase change material segment includes a dopant selected from the group consisting of nitrogen (N), oxygen (O), gallium (Ga), and combinations thereof.

10. A method of forming a phase change material memory array, comprising:
    forming a lower metallization layer on a substrate;
    forming a lower buffer layer on the lower metallization layer;
    forming a selector material layer on the lower buffer layer;
    forming a plurality of upright slabs, where each of the slabs includes an intermediate buffer segment on the selector material layer, a phase change material segment on the intermediate buffer segment, an upper buffer segment on the phase change material segment, and an upper conductive segment on the upper buffer segment;

forming a resistive liner on the plurality of upright slabs;

forming a sidewall spacer layer on the resistive liner; and removing the portions of the sidewall spacer layer and the resistive liner on the upper conductive segment, wherein another portion of the resistive liner remains on the phase change material segment.

11. The method of claim 10, further comprising patterning the selector material layer to form a selector material layer segment.

12. The method of claim 10, wherein the selector material layer is a chalcogenide glass or alloy.

13. The method of claim 12, wherein the chalcogenide glass or alloy includes sulfur (S), selenium (Se), tellurium (Te), arsenic (As), nitrogen (N), germanium (Ge), silicon (Si), or combinations thereof.

14. The method of claim 13, wherein the resistive liner has a thickness in a range of about 1 nm to about 10 nm.

15. A phase change material memory array, comprising:

a lower metallization layer segment on a substrate;

a plurality of upright columns, where each of the upright columns includes a lower buffer plate on the lower metallization layer segment, a phase change material block on the lower buffer plate, an upper buffer plate on the phase change material block, and an upper conductive plate on the upper buffer plate;

an upper metallization layer segment on the upper buffer plate of a subset of the plurality of upright columns;

a first pair of resistive liner segments on opposite sidewalls of each of the plurality of upright columns;

a second pair of resistive liner segments on opposite sidewalls of each of the plurality of upright columns, wherein the second pair of resistive liner segments are arranged 90 degrees from the first pair of resistive liner segments;

a pair of sidewall spacer layer segments on the first pair of resistive liner segments; and a fill layer with air gaps between the upright columns.

16. The phase change material memory array of claim 15, wherein the phase change material block is germanium-antimony-tellurium (GeSbTe).

17. The phase change material memory array of claim 16, wherein the material of the phase change material block includes a dopant selected from the group consisting of nitrogen (N), oxygen (O), gallium (Ga), and combinations thereof.

18. The phase change material memory array of claim 17, wherein the first pair of resistive liner segments are made of a conductive material selected from the group consisting of tantalum nitride (TaN), tantalum aluminum nitride (TaAlN), tantalum aluminum carbide (TaAlC), titanium nitride (TiN), titanium aluminum nitride (TiAlN), titanium aluminum carbide (TiAlC), carbon nanotubes (CNTs), and combinations thereof.

19. The phase change material memory array of claim 15, further comprising a selector material layer segment below each of the plurality of upright columns.

20. The phase change material memory array of claim 19, further comprising a middle buffer plate between the selector material layer segment and the phase change material block.

* * * * *